United States Patent [19]
Schnizlein

[11] Patent Number: 5,477,172
[45] Date of Patent: Dec. 19, 1995

[54] CONFIGURABLE INPUT BUFFER DEPENDENT ON SUPPLY VOLTAGE

[75] Inventor: Paul G. Schnizlein, Austin, Tex.

[73] Assignee: Advanced Micro Devices, Inc., Sunnyvale, Calif.

[21] Appl. No.: 354,337

[22] Filed: Dec. 12, 1994

[51] Int. Cl.$^6$ .................... H03K 19/003; H03K 17/693
[52] U.S. Cl. .................. 327/99; 327/407; 370/112; 326/31; 326/81; 326/34
[58] Field of Search ................ 327/99, 107, 410, 327/413, 389, 391, 407, 379; 326/31, 33, 34, 36, 24, 27, 63, 80, 81, 39; 370/112

[56] References Cited

U.S. PATENT DOCUMENTS

| | | | |
|---|---|---|---|
| 4,755,704 | 7/1988 | Flora et al. ............................ | 327/99 |
| 5,248,906 | 9/1993 | Mahmood .............................. | 307/443 |
| 5,295,174 | 3/1994 | Shimuzu ................................ | 327/407 |
| 5,321,319 | 6/1994 | Mahmood .............................. | 370/443 |
| 5,426,378 | 6/1995 | Ong ........................................ | 326/39 |

*Primary Examiner*—Timothy P. Callahan
*Assistant Examiner*—Jung Ho Kim
*Attorney, Agent, or Firm*—Fulbright & Jaworski

[57] ABSTRACT

An input buffer is described which is configurable depending on whether a 5.0 or 3.3 volt supply voltage is present. The input buffer includes two input buffer circuits. The output of a first input buffer circuit is output as valid data when the supply voltage VCC equals 5.0 volts. The output of the second input buffer circuit is output as valid data when the supply voltage VCC equals 3.3 volts.

6 Claims, 1 Drawing Sheet

CONFIGURABLE INPUT BUFFER DEPENDENT ON SUPPLY VOLTAGE

BACKGROUND OF THE INVENTION

1. Field of the Invention

The present invention relates an input buffer that is configurable depending on the level of the power supply voltage, VCC. The present invention more particularly relates to an input buffer having a trip level of about 1.4–1.5 volts.

2. Brief Description of the Related Technology

Today, more and more integrated circuit devices are required to operate in 5.0 volt environments (desktop computers and workstations) and in 3.3 volt applications (laptop computers). To reduce implementation costs, integrated circuit designers attempt to design integrated circuit devices that are compatible with both operating environments.

In designing input buffers, which connect to TTL-level buses, a need exists for an input buffer circuit that is configurable, depending on the supply voltage level.

SUMMARY OF INVENTION

The present invention is for an input buffer, which can be implemented as part of a I/O buffer to communicate with a TTL-level bus. The present invention will operate in 3.3 and 5.0 volt environments. In the present invention, two input buffer circuits are utilized to properly detect a TTL logic '1' or '0' on the TTL level bus to which both input buffers are connected. The output of each input buffer circuit is connected to a mux. A control signal, which is at a logic '1' or '0', selects the proper input of the mux to be output as a valid DATAOUT, depending on whether the system is operating at 5.0 or 3.3 volts.

Thus, when the control signal indicates a 5.0 volt system is present, the output of the input circuit configured to detect TTL levels with a trip point set for a 5.0 volt power supply will be output from the mux. Likewise, in a 3.3 volt operating environment, the control signal will select the mux output from the input buffer circuit configured to select the proper TTL level with a trip point set for a 3.3 volt operating system. A trip level of 15 approximately 1.4 to 1.5 volts is thereby maintained by selecting the output of either input buffer circuit depending on whether the system is operating at 5.0 or 3.3 volts, without having to modify dynamically the trip level of the input buffer circuit.

DETAILED DESCRIPTION OF THE PREFERRED EMBODIMENT

Figure 1:
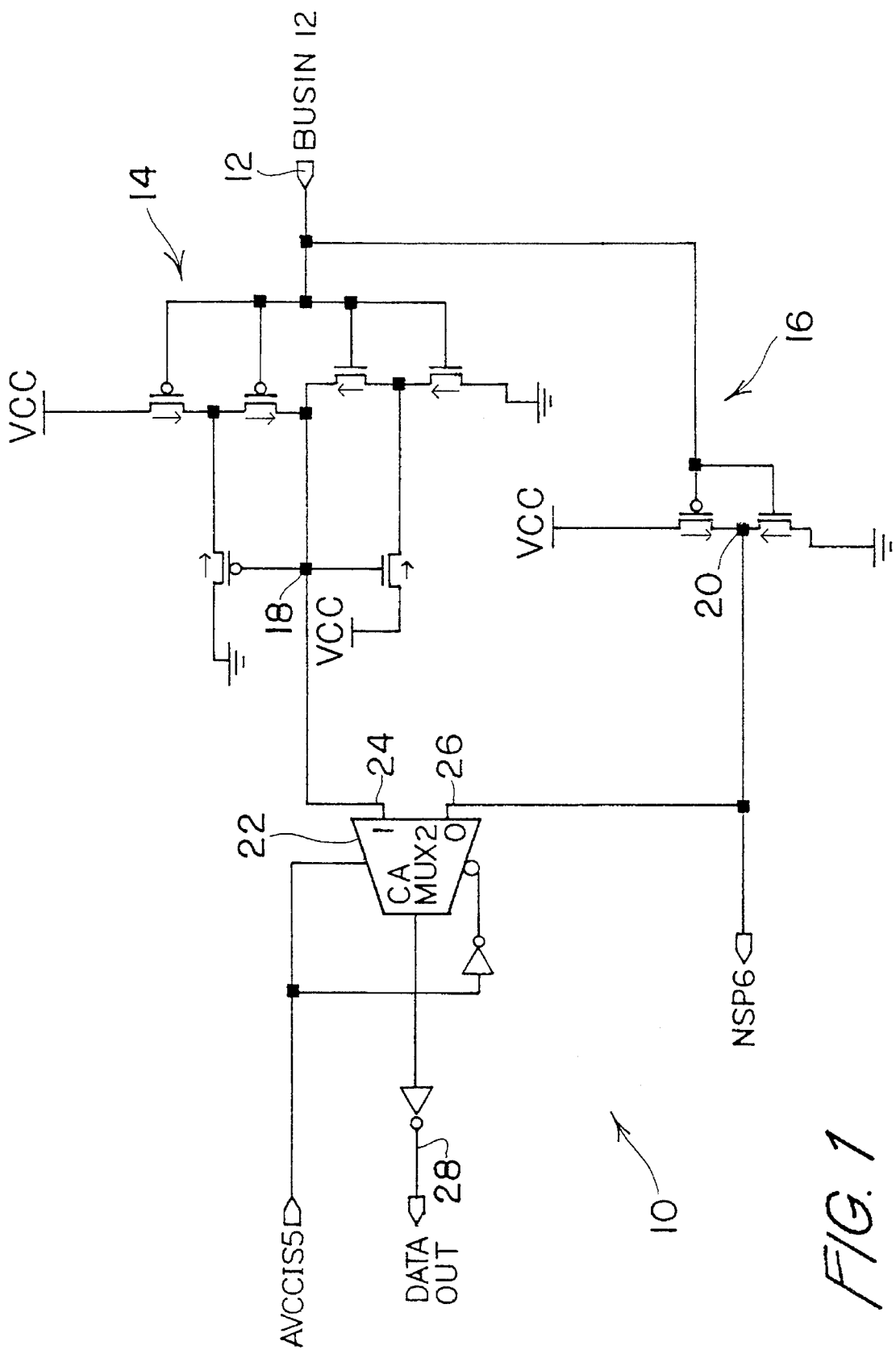
FIG. 1 schematically illustrates the configurable input buffer circuitry of the present invention.

In FIG. 1, the selectable input buffer 10 of the present invention is illustrated. In the preferred embodiment, input buffer 10 is part of a I/O buffer for an audio processing integrated circuit device. It should be understood that input buffer 10 may otherwise be implemented as the input section of any input buffer for any integrated circuit device that connects to a TTL-level bus.

In the preferred embodiment, input signal BUSIN 12, is connected to a TTL-level bus. Input 12 is connected to a single bit-line of the bus. A separate input buffer 10 circuit is utilized for each bit-line connection to a bus. Thus, if a 16-bit bus is utilized, sixteen input buffer 10 circuits would be used, with a separate input buffer 10 circuit connected to each bus bit-line. The present discussion will describe only the operation of input buffer 10 as it connects to a single bit-line, as shown in FIG. 1. The operation of other input buffer 10 circuits having connection to other bit-lines on a bus would be identical and will not be discussed.

Input buffer 10 must discriminate among voltage levels on BUSIN 12 to determine whether a logic '1' or logic '0' is present. Any voltage below 0.8 volts will be interpreted by input buffer 10 as a logic '0' and anything above 2.0 volts will be deemed a logic '1'. When the supply voltage, VCC, is equal to 5.0 volts, input circuit 14 is utilized to detect whether a logic or '0' is present. Input circuit 14, as shown in FIG. 1, is a Schmidt trigger inverter configuration. It should be understood that other input circuit configurations, such as a simple inverter having a trip level at 0.28 * VCC may be utilized.

Input circuit 14 sets the trip level of input buffer 10 to about 1.4 volts. Thus, any voltage higher than 1.4 volts entering BUSIN input 12 will be output by input circuit 14 at input circuit 14 output node 18 as a logic signal. Likewise, any voltage on BUSIN input 12 detected by input circuit 14 being less than 1.4 volts will cause an output on input circuit 14 output node 18 of a logic '0'.

For an operating system of 3.3 volts, however, input circuit 14 is ineffective since the trip point lowers to about 0.84 volts because of the reduced supply voltage. Such a trip point is too low to detect a logic '1' or '0', correctly. Because of temperature and integrated circuit process variations, there is a danger that a voltage of 0.8 volts, or lower, would be incorrectly determined as a logic '1' level input signal. Thus, input circuit 16 is utilized in this case, since it is designed to have a trip level of approximately 1.5 volts in a 3.3 volt operating environment. Input circuit 16 is an inverting input buffer having a trip point of approximately VCC/2.

Using input circuit 16 when VCC=3.3 volts, whenever a voltage level on BUSIN input 12 is 1.5 volts, or greater, a logic '1' is output at input circuit 16 output node 20. Likewise, a voltage level less than 1.5 volts on BUSIN input 12 will cause input circuit 16 to output a logic '0' level at input circuit 16 output node 20.

A control signal, AVCCIS5 is used to control the output of mux 22. Input 24 to mux 22 is the output of input circuit 14. The input 26 of mux 22 is connected to the output of input circuit 16. As shown in FIG. 1, input circuit 14 and 16 are both connected to BUSIN input 12. Control signal AVCCIS5 controls mux 22 such that when operating at 5.0 volts, with AVCCIS5 a logic '1', mux 22 selects input 24, which is the signal output from input circuit 14, which then provided to output node 28 a DATAOUT signal. When operating at 3.3 volts, with control signal AVCCIS5 a logic '0', input 26 of mux 22 is selected, which is the signal output from input circuit 16.

By having two input circuits, 14 and 16, and by selecting the output of either, depending whether VCC equals 5.0 or 3.3 volts using control signal AVCCIS5, the trip level for input buffer 10 is maintained at about 1.4 to 1.5 volts, regardless of the power supply voltage. Thus, the difficulty of maintaining a ratio trip level which would change as the power supply voltage changes, is eliminated.

The present invention, therefore, is well adapted to carry out the objects and attain the ends and advantages mentioned herein as well as other ends and advantages made apparent from the disclosure. While preferred embodiments of the invention have been described for the purpose of disclosure, numerous changes and modifications to those embodiments described herein will be readily apparent to those skilled in the art and are encompassed within the spirit of the invention and the scope of the following claims.

What is claimed is:

1. An input buffer, comprising:

a first input buffer circuit, including an input connected to a TTL level bus bit-line, and an output;

a second input buffer circuit, including an input connected to said TTL level bus line, and an output wherein a supply voltage is connected to said first and second input buffer circuits;

a multiplexer, including, a first input connected to said output of said first input buffer circuit, a second input connected to said output of said second input buffer circuit, and an output controlled by a logic level of a control signal input to said multiplexer, wherein the logic level of said control signal is decided depending on whether a 5.0 or 3.3 volt supply voltage is present.

2. The input buffer of claim 1, wherein said logic level of said control signal is a logic '2' when a 5.0 volt supply voltage is present and is a logic '0' when a 3.3 volt supply voltage is present.

3. The input buffer of claim 1, wherein said first input buffer circuit has a trip level of about 1.4 volts when a 5.0 volt supply is present, and said second input buffer circuit has a trip level of about 1.5 volts when 3.3 volt supply is present.

4. The input buffer of claim 1, wherein said first input buffer circuit includes a Schmidt trigger inverter circuit.

5. The input buffer of claim 1, wherein said second input buffer circuit is an inverter circuit.

6. A configurable input buffer, comprising:

a Schmidt trigger inverter input buffer circuit, including an input connected to a TTL level bus bit-line; and a TTL level output;

an inverter circuit input buffer, including an input connected to a TTL level bus bit-line, and an output wherein a supply voltage Vcc is connected to said Schmidt trigger inverter input buffer circuit and said inverter circuit input buffer;

a multiplexer, including a first input connected to said output of said Schmidt trigger inverter input buffer circuit output and a second input connected to said output of said inverter circuit input buffer, wherein when the supply voltage VCC is about 5.0 volts a control signal selects said multiplexer first input to be output from said multiplexer, and when the supply voltage VCC is about 3.3 volts said control signal selects said multiplexer second input to be output from said multiplexer.

* * * * *